United States Patent [19]

Warren

[11] 3,821,563

[45] June 28, 1974

[54] ASYNCHRONOUS BAND-PASS PULSE WIDTH FILTER

[75] Inventor: Samuel C. Warren, Indianapolis, Ind.

[73] Assignee: The United States of America as represented by the Secretary of the Navy, Washington, D.C.

[22] Filed: June 18, 1973

[21] Appl. No.: 371,030

[52] U.S. Cl. .................. 307/234, 328/112, 328/167, 328/111;112;167

[51] Int. Cl. .................. H03k 5/18

[58] Field of Search .................. 307/234

[56] References Cited

UNITED STATES PATENTS

| | | | |
|---|---|---|---|
| 2,947,945 | 8/1960 | Relis et al. | 328/112 |
| 3,122,647 | 2/1964 | Huey | 328/112 X |
| 3,555,438 | 1/1971 | Ragsdales | 307/234 X |
| 3,693,101 | 9/1972 | Trimble | 307/234 X |
| 3,735,271 | 5/1973 | Leibowitz | 328/112 |

*Primary Examiner*—John Zazworsky

*Attorney, Agent, or Firm*—R. S. Sciascia; Paul S. Collignon

[57] ABSTRACT

A band-pass pulse width filter for filtering a sequence of positive going digital pulses. A first pulse width filter having four two-stage logic circuits blocks pulses having a width lesser than a first predetermined width and provides an output for all other pulses. A second pulse width filter having four two-stage logic circuits has an input coupled to the output of said first pulse width filter and blocks pulses having a width greater than a second predetermined width. The output of the second pulse width filter consists of positive going digital pulses having a width greater than said first predetermined width and a width lesser than said second predetermined width.

5 Claims, 2 Drawing Figures

PATENTED JUN 28 1974 3,821,563

ASYNCHRONOUS BAND-PASS PULSE WIDTH FILTER

BACKGROUND OF THE INVENTION

The present invention relates to pulse width selecting filters and more particularly to a band-pass pulse width filter capable of filtering out pulses of pulse widths lesser than a first predetermined pulse width and pulse widths greater than a second predetermined pulse width.

Prior known pulse width selecting filters utilize a series of delay lines to delay and analyze pulse widths. One such delay line device is shown and described in U.S. Pat. No. 3,317,831, entitled, "Delay Line Filter Wherein Plural Delay Lines Are Series Connected, The Time Delays Of Which Increase In An Arithmetic Progression" which issued May 2, 1967, to Nathan Marchand. In this patented delay line filter, the filter is in the form of multiple cascaded delay lines which are compensated in respect to delay time for rate of frequency scan.

Another pulse width selecting filter is shown and described in U.S. Pat. No. 3,676,699, entitled, "Asynchronous Pulse Width Filter," which issued to Samuel C. Warren, on July 11, 1972. In this pulse width filter a circuit is shown and described which is capable of filtering out pulses of pulse width less than a predetermined pulse width and passing output pulses of original width and in the same relative position for input pulses of equal or greater pulse width than the predetermined pulse width.

SUMMARY OF THE INVENTION

The present invention provides an electronic filter capable of pulse discrimination on the basis of pulse width. The circuit device of the present invention will block all pulses in an incident series of positive going pulse that have a pulse width lesser than a presettable minimum value, such as $\Delta t_1$ and a pulse width greater than a presettable maximum value, such as $\Delta t_2$. The passed pulses will appear at the output of the filter with unmodified pulse width and relative position. A first pulse width filter of the kind described in the inventor's above-mentioned patent is used to block pulse width lesser than a presettable minimum value and the output of the first pulse width filter is applied as an input to a second pulse width filter which blocks all pulses having a pulse width greater than the presettable maximum value. The output of the second filter consists of positive going digital pulses having a width greater than said presettable minimum value and a width lesser than said presettable maximum value.

It is therefore a general object of the present invention to provide a band-pass filter capable of filtering a sequence of positive going digital pulses by blocking all pulses having a pulse width lesser in width than a first predetermined width and all pulses having a pulse width greater in width than a second predetermined width.

Other objects and advantages of the present invention will become more apparent to those skilled in the art as a more detailed description is provided along with the accompanying drawing.

DESCRIPTION OF THE PREFERRED EMBODIMENT

Figure 1:
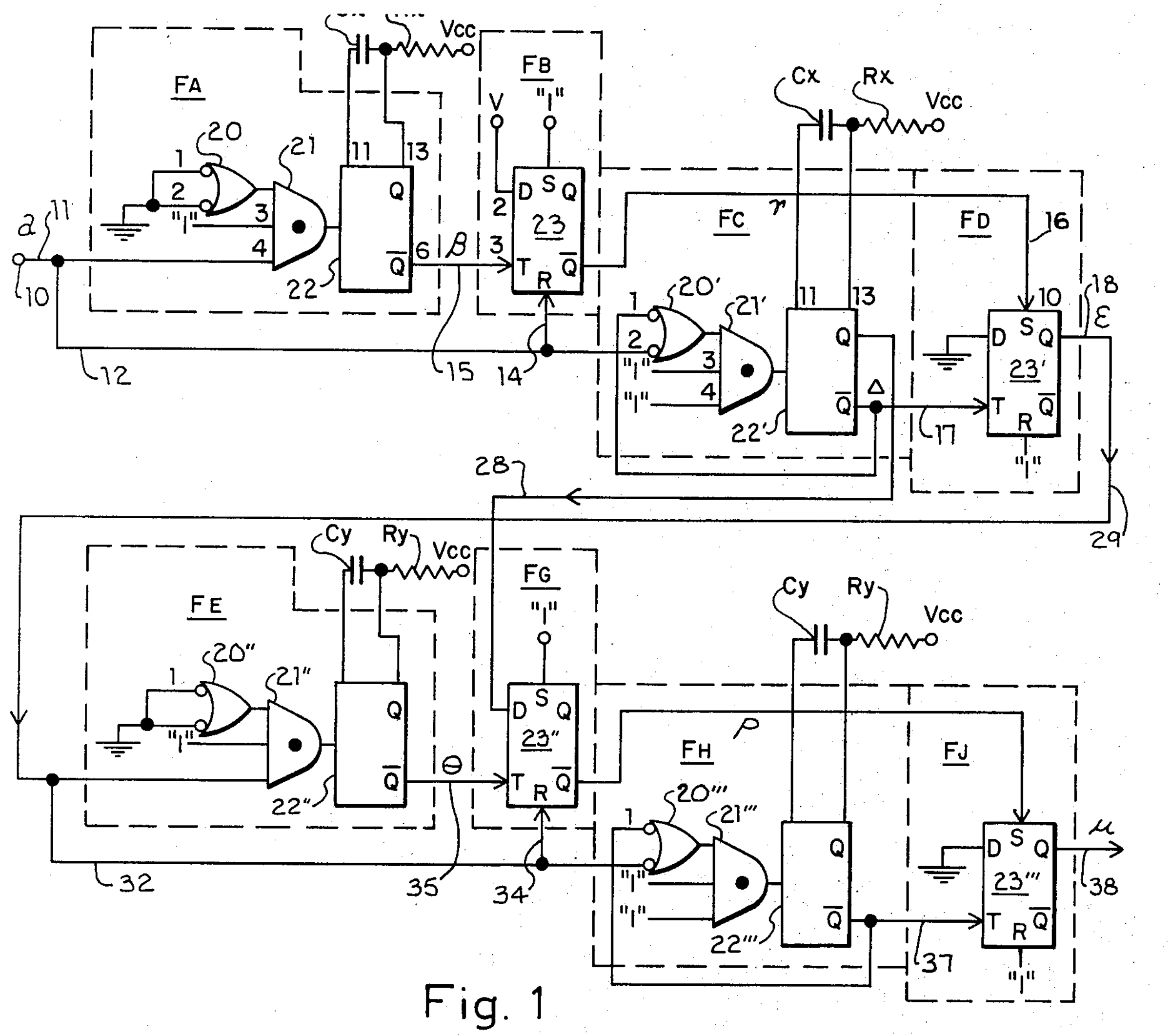
FIG. 1 is a block circuit diagram showing a preferred embodiment of the present invention.

Referring to the drawing, the band-pass pulse width filter of the present invention is basically comprised of two asychronous pulse width filters which were invented by the present inventor and which issued July 11, 1972, as U.S. Pat. No. 3,676,699. As shown in FIG. 1 of the drawing, one asynchronous pulse width filter is comprised of logic circuits $F_A$, $F_B$, $F_C$, and $F_D$ and the second asynchronous pulse width filter is comprised of logic circuits $F_E$, $F_G$, $F_H$, and $F_J$. $F_A$ and $F_E$ are similar and are integrated circuits (IC) that can be, from a functional standpoint, any retriggerable arrangement of circuitry capable of delaying the leading edge of input pulses by a presettable amount of time. Logic circuits $F_A$ and $F_E$ are shown in their component parts as originally used in a developmental model as a Fairchild retriggerable monostable multivibrator No. 9601, although ICs or microcircuits of other known types and makes may be utilized. $F_A$ and $F_E$ each consist of an OR gate 20 having inverting inputs thereto with the output thereof coupled as one input to an AND gate 21, the output of which AND gate is coupled as an input to a multivibrator 22 having outputs Q and $\bar{Q}$. The multivibrator 22 has an RC timing network external to the IC coupled to terminals 11 and 13 from a voltage source $V_{cc}$ through a resistor $R_x$ and capacitor $C_x$. Whenever the multivibrator 22 is triggered with a binary "1" input, it will remain in its changed state, as where the Q output goes from "0" to "1," for a time determined by the $R_xC_x$ time constant for the capacitor $C_x$ to change at which time the Q output will return to "0." Terminals 1 and 2 of the inverted input OR gate 20 are coupled in common to ground which will produce a continuous binary "1" output as one input to the AND gate 21. The input terminal 3 to AND gate 21 has a voltage standing thereon representative of a binary "1" input and the fourth terminal of AND gate 21 is coupled to terminal 10 through the conductor 11 to which the random width pulses are applied. This arrangement of $F_A$ and $F_E$ provides retriggerable monostable multivibrators which can be made to trigger on only a positive-going edge, such as a binary transition from "0" to "1" by making the trigger pulse input on either of the AND gate inputs 3 or 4. By this arrangement the multivibrators 22 are triggered only when the AND gate 21 input thereto goes from a "0" to "1" state. The $R_xC_x$ timing circuit is preset by the values of these elements to delay the leading edge of an input pulse by an amount $\Delta t_1$.

The $\beta$ output pulses of $F_A$ are applied to $F_B$and, likewise, the $\theta$ output pulses of $F_E$ are applied to $F_G$. The outputs $\beta$ and $\theta$ are negative-going pulses, or binary "1" to "0" to "1," with the leading edge of each pulse being synchronous within the propagation delay with the delayed leading edge of $\alpha$. The trailing edge of $\beta$ is the delayed leading edge of $\alpha$ providing a "0" to "1" transition, delayed by the amount Δt and, likewise, the trailing edge of $\theta$ is the delayed leading edge of $\epsilon$, which is the output from $F_D$ which is supplied as an input to $F_E$.

$F_B$ and $F_G$ are ICs and, by way of example, might be a Motorola type "D" flip-flop No. MC 3060, although other ICs or microcircuits may be used whenever desired. In these ICs, a voltage representative of a binary "1" is applied to the D terminal and to the S terminal while the input pulses are applied to the T clock terminals and the R terminals. A voltage source is provided for supplying voltage to the D terminal of flip-flop 23, however, the input to the D terminal of flip-flop 23'' is supplied from an output of flip-flop 22', as hereinafter described. As shown in FIG. 1 of the drawing, the input of $\beta$ pulses is applied to the T terminal of flip-flop 23 and the input of $\alpha$ pulses is applied to the R terminal of flip-flop 23. Likewise, the input of $\theta$ pulses is applied to the T terminal of flip-flop 23'' and the input of $\epsilon$ pulses is applied to the R terminal of flip-flop 23''. The output conductor 16 of flip-flop 23 is taken from the $\overline{Q}$ terminal on which the $\gamma$ pulses are developed. The terminal Q is open ended and the complement of Q is produced on the $\overline{Q}$ output, as well understood by those skilled in the art. $F_B$ will shift only when the input state at T changes from the "0" state to the "1" state and both S and R inputs are held at the "1" state during the transition. The S input is the asynchronous SET input. Similarly the R input is the asynchronous RESET input. A "0" state at the S input will unconditionally cause the Q output to be at a "1" state and/or a "0" state at the R input will unconditionally cause the Q output to be a "1" state. The $\beta$ input at the T terminal operates as the clock input and a $\alpha$ is applied to the R terminal or the asynchronous RESET INPUT. Since the terminals D and S inputs are always at the "1" state, it should be apparent that the $\overline{Q}$ output of $F_B$ can be shifted to the "0" state only when the trailing edge of $\beta$, or "0" to "1" transition occurs while $\alpha$ is at a high or "1" state. Since $F_A$ is a retriggerable function, $\overline{Q}$ of $F_B$ can be changed to "0" only by a valid pulse in which the pulse width of $\alpha$ is greater than $\Delta t$; therefore the last $\alpha$ pulse to trigger $F_A$ is still in the high state when the trailing edge of $\beta$ occurs and $\overline{Q}$ output of $F_B$ will be shifted to the "0" state by the trailing edge of $\beta$. It should be equally apparent from the preceding statements that if the pulse width of $\alpha$ is less than $\Delta$t, $\alpha$ will cause no change to occur at the $\overline{Q}$ output of $F_B$ since the trailing edge of $\beta$ will occur after the trailing edge of $\alpha$ and the R input to $F_B$ will be changed to "0" state. This input condition, as previously mentioned, unconditionally maintains the $\overline{Q}$ output of $F_B$ at the "1" state.

The ICs $F_C$ and $F_H$ may be of a type marketed by Fairchild as a retriggerable monostable multivibrator No. 9601, quite the same as used for $F_A$ and $F_E$. As $F_C$ and $F_H$ are identical except for the values of the resistors and capacitors, the operation of $F_C$ only will be described. The monostable multivibrator circuit $F_C$ is made nonretriggerable by coupling the $\overline{Q}$ output from the multivibrator 22' back to terminal 1 of the inverted input OR gate 20'. The input of $\alpha$ pulses from terminal 10 is coupled by the branch conductor 12 to the inverted input terminal 2 of OR gate 20'. Terminals 3 and 4 of AND gate 21' are coupled to a voltage source providing a "1" state on these inputs. The $R_xC_x$ timing network, coupled external to the IC, is the same as the $R_xC_x$ timing network of $F_A$ to time the period that the Q output remains in its "1" state after being triggered thereto by an input pulse, being a random pulse $\alpha$.

Since the input terminal 2 to OR gate 20' is through an inverter, the trailing edge of $\alpha$ will trigger the multivibrator 22' when $\alpha$ goes from "1" to "0" if the nonretriggerable inverted input to terminal 1 of OR gate 20' is in the "1" or high state. Since a "0" state input to an inverted input OR gate makes its output assume unconditionally a "1" state, the trailing edge of $\alpha$ can initially trigger $F_C$ causing the $\overline{Q}$ output to go to a "0" state and there remain for a period $\Delta$t after which a new trailing edge cannot be passed through the OR gate, thus preventing retriggerable operation. The $\overline{Q}$ output of $F_C$ once triggered to the "0" state will so remain, as in the case of $F_A$, until the interval of time $\Delta t$ has gone by at which time the $\overline{Q}$ output returns to the "1" state and the function can once again be triggered. The output $\overline{Q}$ on conductor 17 is illustrated as $\Delta$ and is applied to the T terminal of flip-flop 23'. Also the output Q is applied to the D terminal of flip-flop 23'', as a trailing edge start signal (T.E.S.). The T.E.S. signal is the logical compliment of the $\Delta$ signal and is used to locate in time the end or trailing edge of an input pulse.

The ICs $F_D$ and $F_J$ are identical and are of the same type of flip-flop as the IC $F_B$, and only $F_D$ will be described. As shown in the drawing, the D input is grounded, the S input is coupled to conductor 16 over which the $\gamma$ pulses from $F_B$ are conducted, the $\overline{Q}$ output is opened ended and the output 18 is taken from the Q output over which pulses $\epsilon$ are conducted to $F_E$. In the multivibrator $F_D$, a shift can only occur when the input state at terminal T changes from the "0" state to the "1" state and both S and R inputs are held at the "1" states during the clock transition at input T. The S input is the asynchronous SET input. A "0" state at this input will unconditionally cause the Q output to be at a "1" state. Similarly the R input is the asynchronous RESET input. A "0" state at this input will unconditionally cause the Q output to be at a "1" state. When a $\gamma$ pulse occurs, its leading edge (1 to 0) corresponds to the delayed leading edge of a valid $\alpha$ pulse, remembering that a valid $\alpha$ pulse is one in which the pulse width is greater than $\Delta t_1$. Since $\gamma$ is a "1" - "0" - "1" or negative-going pulse and its input is to the S terminal of $F_D$, the Q output of $F_D$ will change from the "0" state to a "1" state synchronously with the leading edge of $\gamma$ and therefore with the delayed leading edge of the corresponding valid $\alpha$ pulse. At this point the operation of the asynchronous pulse width filter on the leading edge of the valid $\alpha$ pulse is complete since the leading edge has been passed to the output 18 delayed by $\Delta t_1$. It remains only to return the Q output of $F_D$ to a "0" state at the proper time so that the asynchronous pulse width filter output $\epsilon$ on conductor 18 will correspond to the incident valid $\alpha$ pulse unchanged in pulse width. This is accomplished when the $\Delta$ pulse trailing edge, which is synchronous with the delayed trailing edge of the valid $\alpha$ pulse, occurs at the clock input T of $F_D$. This "0" to "1" transition shifts the "0" state at the D input to the Q output thus completing the asynchronous pulse width filter operation on the valid $\alpha$ pulse trailing edges.

The output $\mu$ from $F_J$ is all the pulses that are not blocked by the two pulse width filters and these pulses are delayed by a fixed amount of time equivalent to $\Delta t_2$. The pulse width and relative timing of the pass-band pulse is not changed. Values of $\Delta t_1$ and $\Delta t_2$ are related as follows:

$$_2\Delta t_1 > \Delta t_2. \quad (1)$$

OPERATION

Figure 2:
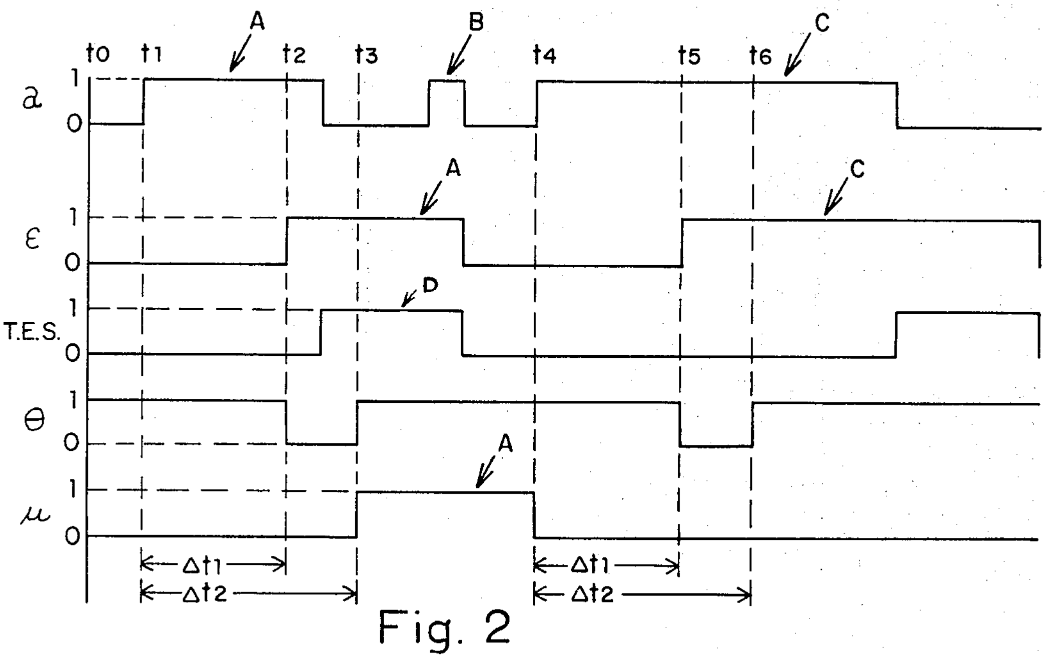
FIG. 2 illustrates a series of related waveforms as they occur on the several inputs and outputs shown in FIG. 1 of the drawing.

Referring now to FIG. 2 of the drawing, there is shown for purposes of illustration, three $\alpha$ pulses A, B, and C, with pulses A and C being greater in width than $\Delta t_1$ and pulse B being lesser in width than $\Delta t_1$. In addition, pulse A is lesser in width than $\Delta t_2$ and pulse C is greater in width than $\Delta t_2$. As pulses A and C are greater in width than $\Delta t_1$, these pulses are passed by the pulse width filter comprised of components $F_A$, $F_B$, $F_C$, and $F_D$, in a manner more fully described in the above-referenced patent. As pulse B is lesser in width than $\Delta t_1$, pulse B is blocked and thus, as shown in FIG. 2 of the drawing, the output $\epsilon$, which is the passed pulses, are pulses A and C. The trailing edges of the passed pulses are delayed by an amount of time $\Delta t_1$.

The $R_yC_y$ time control circuit in $F_E$ is designed to delay the leading edge of an input pulse $\epsilon$ by an amount $\Delta t_2 - \Delta t_1$. The output $\theta$ from $F_E$ is a negative-going pulse, or binary "1" to "0" to "1," with the width of the negative-going pulse defining the delay parameter, that is $\Delta t_2 - \Delta t_1$. The trailing edge start (T.E.S.) signal is applied to the D input of flip-flop 23'' and when the time constant provided by $R_yC_y$, that is $\Delta t_2 - \Delta t_1$ is greater than $\Delta t_1$ subtracted from the pulse width, the T.E.S. signal will enable flip-flop 23'' and thus pass the $\theta$ input signal to flip-flop 23'''. As shown in FIG. 2 of the drawing, a T.E.S. pulse D has a starting edge which coincides with the trailing edge of pulse A. It can be seen that the starting edge of pulse D lies within the $\theta$ pulse width, thus indicating that the width of pulse A is less than $\Delta t_2$. As pulse A has previously been determined to be greater in width than $\Delta t_1$, otherwise it would have been blocked, by the first filter, then it has been determined that the pulse width of A is greater than $\Delta t_1$, but less than $\Delta t_2$. Thus pulse A appears as an output $\mu$ from flip-flop $F_J$. Pulse C, likewise, is greater in width than $\Delta t_1$ and is passed as an input into $F_E$. The trailing edge from pulse C, however, does not occur within the limits of $\Delta t_2 - \Delta t_1$ and thus flip-flop 23'' is not enabled and pulse C does not pass on to flip-flop 23'''. It can thus be seen that pulse B was immediately rejected because it did not meet a minimum desired width. Pulse C did meet the minimum desired width and thus passed the first filter stage, but was rejected by the second filter stage because it was too wide.

It can thus be seen that the present invention provides an electronic device capable of filtering a sequence of positive-going digital pulses in such a manner as to block those pulses of the sequence having a pulse width less than a first predetermined width and greater than a second predetermined width. The passes pulses are delayed in time, however, their width and the relative timing of the passed pulses is not changed.

Obviously many modifications and variations of the present invention are possible in the light of the above teachings. It is therefore to be understood that within the scope of the appended claims the invention may be practiced otherwise than as specifically described.

I claim:

1. An asynchronous band-pass filter comprising:

an input of random width pulses, a first asynchronous pulse width filter coupled to said input of random width pulses blocking pulses having a width less than a first predetermined width and providing an output of pulses having a width greater than said first predetermined width, means in said first asynchronous pulse width filter for indicating the trailing edge of each output pulse of said first asynchronous pulse width filter, and a second asynchronous pulse width filter having a first input coupled to the output of pulses from said first asynchronous pulse width filter and having a second input coupled to said means in said first asynchronous pulse width filter for indicating the trailing edge of each output pulse whereby said second asynchronous pulse width filter blocks pulses having a width greater than a second predetermined width and provides an output of pulses having a width greater than said first predetermined width and lesser than said second predetermined width.

2. An asynchronous band-pass filter as set forth in claim 1 wherein said first asynchronous pulse width filter is comprised of, a retriggerable multivibrator having an input coupled to said input of random pulses, having a delay network capable of delaying the leading edges of input pulses by a first predetermined amount, and having an output for passing selected pulses of width equal to and greater than said first predetermined amount;

a first flip-flop circuit having inputs coupled to said input of random width pulses and to said output of said first multivibrator to trigger a pulse at the delayed leading edge of the selected pulses from said first multivibrator terminating in a trailing edge at the trailing edge of the selected pulse from said input or random width pulses on an output thereof;

a nonretriggerable multivibrator having an input coupled to the input of said random pulses and having a delay network capable of delaying the trailing edge on the output of said first flip-flop circuit on an output thereof said first predetermined amount; and a second flip-flop circuit having one input coupled to the output of said nonretriggerable multivibrator and one input coupled to the output of said first flip-flop circuit to produce a pulse on an output thereof with a leading edge coinciding in time with the first delayed leading edge of the selected pulse output of said retriggerable multivibrator and with a trailing edge coinciding in time with the trailing edge of the selecting pulse with said second delay on the output of said nonretriggerable multivibrator whereby valid pulses of greater width than the width produced by said first predetermined time delay will be passed through said two multivibrators and two flip-flops with the same pulse width and in the same time relations as corresponding selected pulses on said input of random pulses.

3. An asynchronous band-pass filter as set forth in claim 2 wherein said second asynchronous pulse width filter is comprised of, a second retriggerable multivibrator having an input coupled to the output of said first asynchronous pulse width filter and having a delay network capable of delaying the leading edges of input pulses by a second predetermined amount and having an output for passing all input pulses, a third flip-flop circuit having an input coupled to said output of said first asynchronous pulse width filter, a second input coupled to the output of said second retriggerable multivibrator and a third input coupled to said means in said first asynchronous pulse width filter for indicating the trailing edge of each output pulse of said first asynchronous pulse width filter and having an output for passing selected pulses, a second nonretriggerable multivibrator having an input coupled to the output of said first asynchronous pulse width filter and having a delay network capable of delaying the trailing edge on the output of said third flip-flop circuit on an output thereof said second predetermined amount; and a fourth flip-flop circuit having one input coupled to the output of said second nonretriggerable multivibrator and one input coupled to the output of said third flip-flop circuit to produce pulses on an output thereof having a width greater than said first predetermined amount and lesser than said second predetermined amount.

4. An asynchronous band-pass filter as set forth in claim 2 wherein said delay networks of said retriggerable and said nonretriggerable multivibrators are resistance-capacitance networks of values to establish the same said first predetermined delay in time.

5. An asynchronous band-pass filter as set forth in claim 3 wherein said delay network of said second retriggerable and said second nonretriggerable multivibrators are resistance-capacitance networks of values to establish the same said second predetermined delay in time.

* * * * *